(12) United States Patent
Konieczny et al.

(10) Patent No.: US 9,889,878 B2
(45) Date of Patent: Feb. 13, 2018

(54) METHOD OF TUNING A CALIBRATION TABLE FOR AN ELECTRIC POWER STEERING SYSTEM, AND A CALIBRATION SYSTEM THEREFORE

(71) Applicant: GM GLOBAL TECHNOLOGY OPERATIONS LLC, Detroit, MI (US)

(72) Inventors: Theodore P. Konieczny, Williamston, MI (US); Scott P. Sherman, Fenton, MI (US); Aaron Ronald, New Hudson, MI (US); Nathan M. Picot, Farmington Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 244 days.

(21) Appl. No.: 14/967,811

(22) Filed: Dec. 14, 2015

(65) Prior Publication Data

US 2017/0166242 A1 Jun. 15, 2017

(51) Int. Cl.
| | | |
|---|---|---|
| *B62D 5/04* | (2006.01) | |
| *B62D 6/10* | (2006.01) | |
| *B62D 6/00* | (2006.01) | |
| *B62D 6/04* | (2006.01) | |
| *G06F 17/50* | (2006.01) | |
| *G01M 17/06* | (2006.01) | |

(52) U.S. Cl.
CPC ........... *B62D 5/0457* (2013.01); *B62D 6/002* (2013.01); *B62D 6/04* (2013.01); *B62D 6/10* (2013.01); *G06F 17/5095* (2013.01); *G01M 17/06* (2013.01)

(58) Field of Classification Search
CPC ........ B62D 5/0457; B62D 6/002; B62D 6/04; B62D 6/10; G01M 17/06; G06F 17/5095
See application file for complete search history.

(56) References Cited

U.S. PATENT DOCUMENTS

| | | | | |
|---|---|---|---|---|
| 8,346,434 | B2 * | 1/2013 | Tsukasaki | B62D 6/006 280/5.51 |
| 2006/0064223 | A1 * | 3/2006 | Voss | B62K 25/04 701/52 |
| 2007/0249453 | A1 * | 10/2007 | Sugitani | B62D 3/02 475/4 |
| 2014/0238769 | A1 * | 8/2014 | Tamaizumi | B62D 6/04 180/446 |

* cited by examiner

*Primary Examiner* — Richard M Camby
(74) *Attorney, Agent, or Firm* — Quinn IP Law

(57) ABSTRACT

A method of tuning a calibration table for an electric power steering system includes connecting the electric power steering system to an actuator machine, and communicating a control input from a vehicle simulator to the actuator machine. Input forces and steering angles are applied to the electric power steering system with the actuator machine, based on the control input. The electric power steering system is controlled with a steering controller, to apply a steering setting, i.e., and assistive torque. The steering controller uses the calibration table to define the steering setting, based on the applied input forces and steering angles. A steering torque in the electric power steering system generated in response to the applied steering setting is sensed, and communicated to the vehicle controller, thereby establishing a closed loop, feedback system. The calibration table may then be re-defined based on the sensed steering response for the applied input forces.

15 Claims, 2 Drawing Sheets

METHOD OF TUNING A CALIBRATION TABLE FOR AN ELECTRIC POWER STEERING SYSTEM, AND A CALIBRATION SYSTEM THEREFORE

TECHNICAL FIELD

The disclosure generally relates to a calibration system, and a method of tuning a calibration table for an electric power steering system with the calibration system.

BACKGROUND

A vehicle may be equipped with an electric power steering system. The electric power steering system uses an electric motor to assist the driver of the vehicle in turning the steering wheels of the vehicle. Sensors detect the position and torque of the steering column and/or steering wheel, as well as the current operating conditions of the vehicle, and a steering controller applies an assistive torque via the motor, to decrease the amount of torque that the driver must apply to turn the steering wheel, and thereby turn the steering wheels of the vehicle.

The amount of assistive torque that the steering controller controls the motor to apply varies with the operating conditions of the vehicle. The vehicle controller may reference a calibration table that relates various operating conditions of the vehicle to a desired assistive torque. The calibration table is stored in an electronic memory of the steering controller. The calibration table must be defined to provide a desirable amount of assistive torque for the various operating conditions of the vehicle. If the amount of assistive torque is too low, the steering wheel will require a higher level of torque from the driver to turn, which may be undesirable to some drivers. Alternatively, if the assistive torque is too high, the steering wheel may turn too freely, which may also be undesirable for some drivers. Defining the values for the assistive torque in the calibration table may be referred to as tuning the calibration table, and is typically done during vehicle development.

Electric power steering systems are difficult to model electronically. Accordingly, in the past, tuning the calibration table for electric power steering systems has been done by installing the electric power steering system on a prototype vehicle, test driving the prototype vehicle with a defined calibration table, and then adjusting the calibration table based on the subjective feel observed by the test driver of the prototype vehicle.

SUMMARY

A calibration system for tuning a calibration table for an electric power steering system of a vehicle is provided. The calibration system includes an actuator machine that is operable to support the electric power steering system, and apply input forces and a steering angle to the electric power steering system in response to a control input to simulate movement of a vehicle. A vehicle simulator is disposed in electrical communication with the actuator machine. The vehicle simulator is operable to communicate the control input to the hydraulic machine, and receive a sensed steering response from the electric power steering system. The vehicle simulator includes a processor, and non-transitory memory on which are recorded computer-executable instructions, including a simulator algorithm and a vehicle dynamics mathematical model. The vehicle dynamics mathematical model models the operating characteristics of a specific vehicle. The simulator algorithm is operable to reference the vehicle dynamics mathematical model, and generate the control input therefrom, which simulates the movement and operation of that specific vehicle for specific operating conditions.

A method of tuning a calibration table for an electric power steering system of a vehicle is also provided. The method includes connecting the electric power steering system to an actuator machine. The actuator machine is operable to simulate movement of the vehicle. A control input is communicated from a vehicle simulator to the actuator machine. A plurality of input forces and steering angles are applied to the electric power steering system with the actuator machine, based on the control input from the vehicle simulator. The electric power steering system is controlled with a steering controller, to apply a steering setting. The steering controller uses the calibration table to define the steering setting, based on the applied input forces and steering angles. A steering response in the electric power steering system in response to the applied steering setting is sensed with a torque sensor. The calibration table is re-defined to adjust a value of the steering setting based on the sensed steering response for the applied input forces.

Accordingly, the method of tuning the calibration table uses the calibration system to develop the calibration table, without the use of an actual, prototype vehicle. The calibration table for the electric power steering system may be tuned in a lab, for example, regardless of ambient weather and/or road conditions. Additionally, the calibration table may be tuned to pre-defined metrics, thereby establishing consistency between tuning engineers.

The above features and advantages and other features and advantages of the present teachings are readily apparent from the following detailed description of the best modes for carrying out the teachings when taken in connection with the accompanying drawings.

DETAILED DESCRIPTION

Those having ordinary skill in the art will recognize that terms such as "above," "below," "upward," "downward," "top," "bottom," etc., are used descriptively for the figures, and do not represent limitations on the scope of the disclosure, as defined by the appended claims. Furthermore, the teachings may be described herein in terms of functional and/or logical block components and/or various processing steps. It should be realized that such block components may be comprised of any number of hardware, software, and/or firmware components configured to perform the specified functions.

Figure 1:
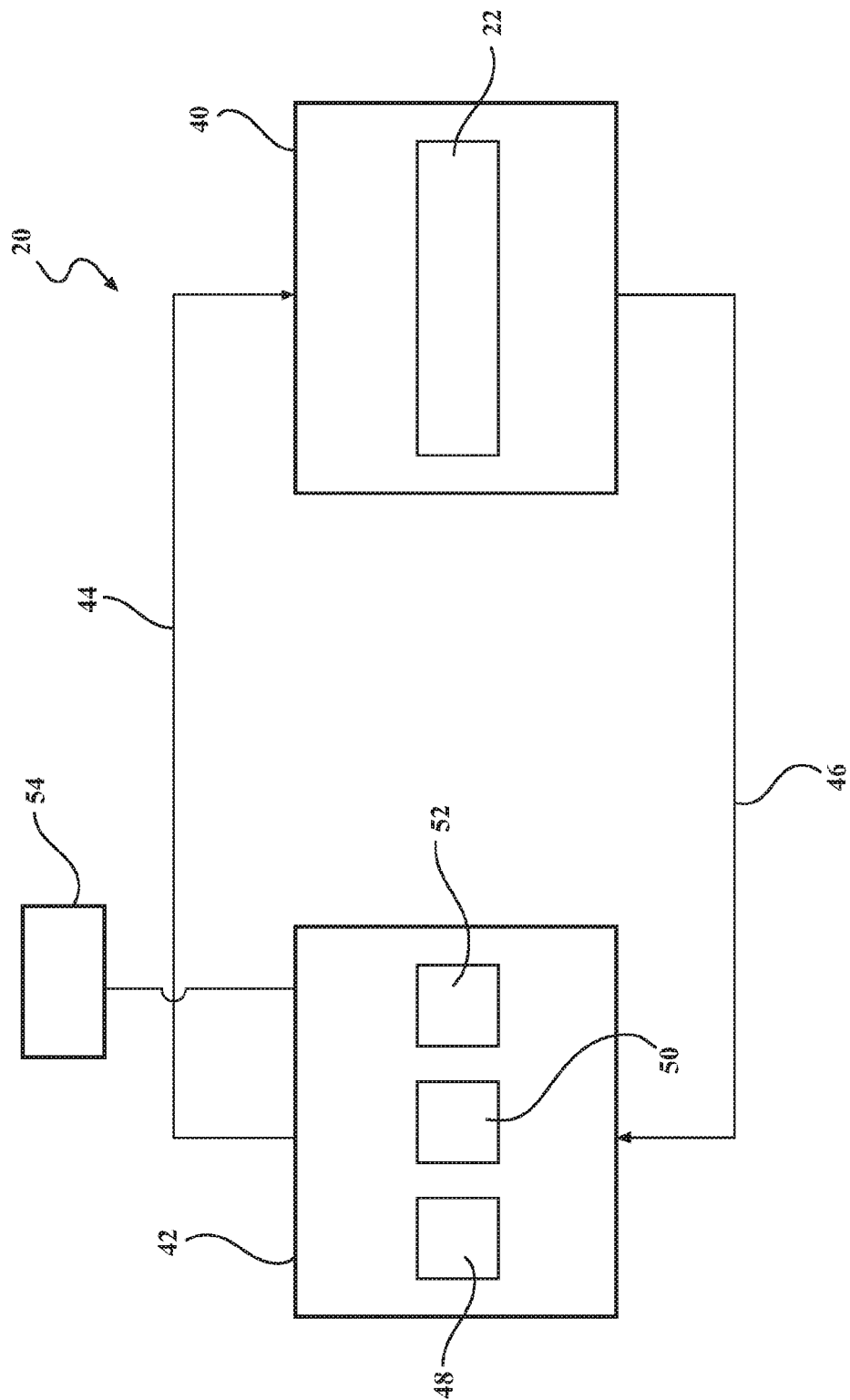
FIG. 1 is a schematic diagram of a simulator system, including a vehicle simulator and an actuator machine.

Referring to the Figures, wherein like numerals indicate like parts throughout the several views, a calibration system is generally shown at 20 in FIG. 1. The calibration system 20 is used for tuning a calibration table 38 for an electric power steering system 22. The calibration table 38 relates various vehicle operating conditions to a desired steering setting. The steering setting may include, for example, an assist torque that is applied by an electric motor 30 of the electric power steering system 22 to a component of the steering system to assist an operator in turning the steering wheel of the vehicle. Accordingly, it should be appreciated that the amount of assist torque applied by the electric motor 30 varies, and is dependent upon the current operating conditions of the vehicle. The values of the steering setting, i.e., the assist torque, for the different possible operating conditions of the vehicle, are defined by and stored in the calibration table 38. During product development, the calibration table 38 is "tuned" i.e., adjusted or modified, to develop the optimum amount of assist torque for the different operating conditions of the vehicle. The calibration table 38 is specific to individual vehicle designs and/or individual steering system configurations, and as such, each new vehicle design and/or configuration of the electric power steering system 22 that uses an electric power steering calibration table 38 requires that the calibration table 38 be tuned for that specific vehicle design and/or configuration.

Figure 2:
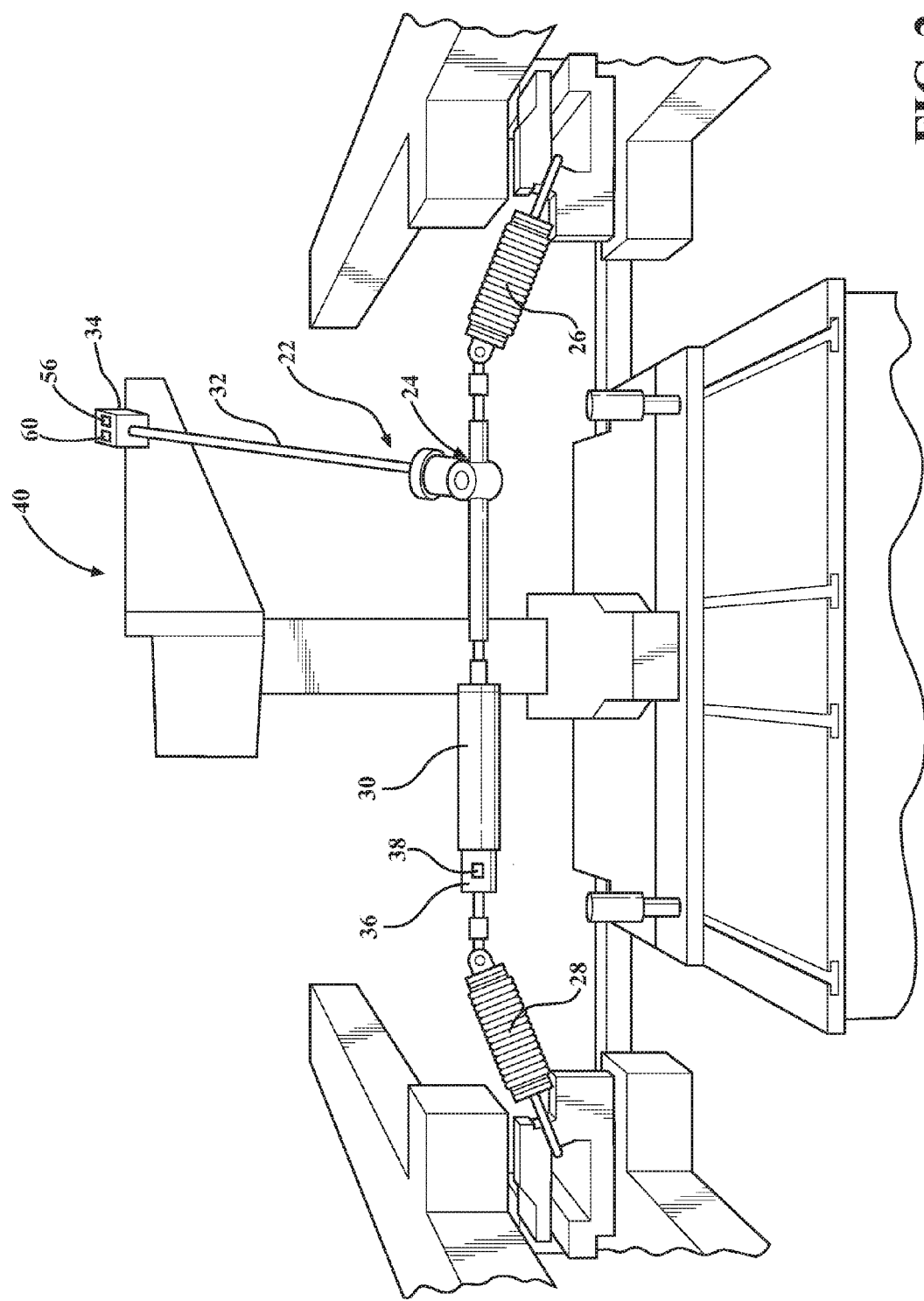
FIG. 2 is a schematic perspective view of the actuator machine supporting an electric power steering system.

Typically, referring to FIG. 2, the electric power steering system 22 includes a steering rack 24 coupled to a left tie rod 26 and a right tie rod 28, and an electric motor 30 operable to apply a variable amount of torque to the steering rack 24. The left tie rod 26 and the right tie rod 28 each include a force transducer for inputting forces into their respective tie rods. The steering rack 24 is connected to the left tie rod 26 and the right tie rod 28 via the steering rack. An intermediate shaft 32 is attached to the steering rack 24, and connects the steering rack 24 with a steer actuator 34. The steer actuator 34 includes a torque sensor 56, and a steering angle sensor 60. The torque sensor 56 is operable to sense steer torque feedback in the intermediate shaft 32. The steering angle sensor 60 is operable to sense and/or determine an angular position of the intermediate shaft 32, and is used for inputting a steering angle to the intermediate shaft 32.

The electric power steering system 22 further includes a steering controller 36. The steering controller 36 and the electric motor 30 are preferably a single unit, and are connected to the steering rack 24. The steering controller 36 may include a control module or a computer that is operable to control the operation of the electric power steering system 22. The steering controller 36 may include a processor, and all software, hardware, memory, algorithms, connections, sensors, etc., necessary to manage and control the operation of the electric power steering system 22. It should be appreciated that the steering controller 36 may include any device capable of analyzing data from various sensors, comparing data, making the necessary decisions required to control the operation of the electric power steering system 22, and executing the required tasks necessary to control the operation of the electric power steering system 22.

The steering controller 36 may be embodied as one or multiple digital computers or host machines each having one or more processors, read only memory (ROM), random access memory (RAM), electrically-programmable read only memory (EPROM), optical drives, magnetic drives, etc., a high-speed clock, analog-to-digital (A/D) circuitry, digital-to-analog (D/A) circuitry, and any required input/output (I/O) circuitry, I/O devices, and communication interfaces, as well as signal conditioning and buffer electronics.

The computer-readable memory may include any non-transitory/tangible medium which participates in providing data or computer-readable instructions. Memory may be non-volatile or volatile. Non-volatile media may include, for example, optical or magnetic disks and other persistent memory. Example volatile media may include dynamic random access memory (DRAM), which may constitute a main memory. Other examples of embodiments for memory include a floppy, flexible disk, or hard disk, magnetic tape or other magnetic medium, a CD-ROM, DVD, and/or any other optical medium, as well as other possible memory devices such as flash memory.

The steering controller 36 includes tangible, non-transitory memory on which are recorded computer-executable instructions, including a steering assist selection algorithm. The processor of the steering controller 36 is configured for executing the steering assist selection algorithm. The steering assist selection algorithm implements a method of selecting a value for a steering setting to be applied to the electric power steering system 22. The steering setting may include or otherwise be defined as an assist torque. The steering assist selection algorithm references the calibration table 38 to define a value of the steering setting, based on the current operating conditions. Accordingly, the calibration table 38 may be stored in a memory device of the steering controller 36 in the form of a data file or the like.

Referring to FIG. 1, the calibration system 20 includes an actuator machine 40, and a vehicle simulator 42. The actuator machine 40 is operable to support the electric power steering system 22 and apply input forces and steering angles to the electric power steering system 22 in response to a control input 44 from the vehicle simulator 42, to simulate movement of a vehicle. One embodiment of the actuator machine 40 includes a plurality of hydraulic actuators that are operable to move the electric power steering system 22 in multiple directions to simulate operation of a vehicle. For example, the actuator machine 40 may include five degrees of freedom to simulate vehicle jounce, vehicle rebound, a steering angle, vehicle left turn, and vehicle right turn. The control inputs 44 include the steer angle input by the steer actuator 34, and tie rod forces input by the force transducers in the left tie rod 26 and the right tie rod respectively 28. The actuator machine 40 senses in output, which is steer torque feedback. The steer torque feedback is sensed by the torque sensor 56, disposed in the steer actuator 34.

The vehicle simulator 42 is disposed in electrical communication with the actuator machine 40. The vehicle simulator 42 is operable to communicate the control inputs 44 to the hydraulic machine, and receive the steer torque feedback, referred to hereafter as the sensed steering response 46, from the electric power steering system 22. More specifically, the steer actuator 34 senses the sensed steering response 46 from the electric power steering system 22, and communicates the sensed steering response 46 to the vehicle simulator 42, described in greater detail below. The vehicle simulator 42 and the actuator machine 40 may communicate in any suitable manner, such as through a high speed communication protocol.

The vehicle simulator 42 may include a computer of other similar device that is operable to control the operation of the actuator machine 40. The vehicle simulator 42 may include a processor, and include all software, hardware, memory, algorithms, connections, sensors, CAN communication modules, etc., necessary to manage and control the operation of the actuator machine 40. As such, a method of tuning the calibration table 38, described below, may be at least partially embodied as a program operable on the vehicle simulator 42. It should be appreciated that the vehicle simulator 42 may include any device capable of analyzing data from various sensors, comparing data, making the necessary decisions required to control the operation of the actuator machine 40, and executing the required tasks necessary to control the operation of the actuator machine 40.

The vehicle simulator 42 may be embodied as one or multiple digital computers or host machines each having one or more processors, read only memory (ROM), random access memory (RAM), electrically-programmable read only memory (EPROM), optical drives, magnetic drives, etc., a high-speed clock, analog-to-digital (A/D) circuitry, digital-to-analog (D/A) circuitry, and any required input/output (I/O) circuitry, I/O devices, and communication interfaces, as well as signal conditioning and buffer electronics.

The computer-readable memory may include any non-transitory/tangible medium which participates in providing data or computer-readable instructions. Memory may be non-volatile or volatile. Non-volatile media may include, for example, optical or magnetic disks and other persistent memory. Example volatile media may include dynamic random access memory (DRAM), which may constitute a main memory. Other examples of embodiments for memory include a floppy, flexible disk, or hard disk, magnetic tape or other magnetic medium, a CD-ROM, DVD, and/or any other optical medium, as well as other possible memory devices such as flash memory.

The vehicle simulator 42 may include tangible, non-transitory memory on which are recorded computer-executable instructions, including but not limited to a simulator algorithm 48, a vehicle dynamics mathematical model 50, and an animation algorithm 52. The processor of the vehicle simulator 42 is configured for executing the simulator algorithm 48, the vehicle dynamics mathematical model 50, and the animation algorithm 52.

The vehicle dynamics mathematical model 50 is a mathematic model of the specific vehicle that the calibration table 38 is to be tuned for. The vehicle dynamics mathematical model 50 describes the physical configuration and operating characteristics of that specific vehicle. The vehicle dynamics mathematical model 50 may be saved as a program or set of data files in the memory of the vehicle simulator 42. The vehicle dynamics mathematical model 50 describes the vehicle mass and loads, vehicle kinematics and compliance, center of gravity, tire characteristics, vehicle alignment and geometry, etc. The vehicle dynamics mathematical model 50 may describe any physical attribute of the vehicle being simulated, whether specifically mentioned herein or not.

The simulator algorithm 48 simulates the operation of one or more control modules of the specific vehicle to which the calibration table 38 is to be tuned to. Accordingly, the simulator algorithm 48 must be programmed for each specific vehicle. The simulator algorithm 48 references and/or interacts with the vehicle dynamics mathematical model 50 in order to generate the control inputs 44 used to control the actuator machine 40 to simulate the movement and operation of that specific vehicle. It should be appreciated that the control inputs 44 may include more than a single command, and will typically include multiple commands, such as but not limited to, a steering angle, a left side tie rod force, and/or a right side tie rod force. The simulator algorithm 48 houses all input/output signals and communications protocols between real and virtual control units. The simulator algorithm 48 may also contain corrective math and mathematical equivalents of subsystem components.

The vehicle simulator 42 may further include the animation algorithm 52. The animation algorithm 52 may be used to generate a visual representation on a display device 54. The visual representation may include, for example, a view of the vehicle moving along a path corresponding to the control input 44. For example, if the control input 44 is defined to simulate a left hand turn, then the visual representation may display the vehicle making a left hand turn. The visual representation depicts the estimated movement of the vehicle as the actuation machine manipulates the electric power steering system 22, based on the control input 44 from the vehicle simulator 42. The display device 54 may include any device capable of displaying a moving image, such as but not limited to a computer monitor or other similar device.

The method of tuning the calibration table 38 for the electric power steering system 22 is described below. In order to tune the calibration table 38, the vehicle dynamic mathematical model 50 must first be defined. As noted above, the vehicle dynamic mathematical model 50 is used to model the operating characteristics of the specific vehicle for which the electric power steering calibration table 38 is to be tuned. Once the vehicle dynamic mathematical model 50 is defined, it is saved in the memory of the vehicle simulator 42, or some other suitable device that is linked or otherwise connected to and able to communicate with the vehicle simulator 42.

The simulator algorithm 48 must also be defined and saved in the memory of the vehicle simulator 42. As noted above, the simulator algorithm 48 simulates the operation of the control modules of the specific vehicle for which the electric power steering calibration table 38 is to be tuned. The simulator algorithm 48 references and/or interacts with the vehicle dynamic mathematical model 50 to generate a mathematical equivalent of a simulated vehicle, which is used to generate the control inputs 44 for controlling the actuator machine 40.

The electric power steering system 22 may then be connected to the actuator machine 40. As noted above, the actuator machine 40 is operable to simulate movement of the vehicle in response to the control inputs 44 from the vehicle simulator 42. Once the electric power steering system 22 is connected to the actuator machine 40, the electric power steering system 22 and the actuator machine 40 must be adjusted so that a steering torque of the electric power steering system 22 is approximately equal to zero. Accordingly, the system is zeroed to begin the testing process. The steering torque in the electric power steering system 22 is adjusted to zero prior to communicating the control input 44 to the actuator machine 40, so that an accurate measurement of the steering torque generated in response to only the control inputs 44 may be measured.

Adjusting electric power steering system 22 and the actuator machine 40 so that the steering torque is approximately equal to zero may include, for example, sensing the steering torque in the electric power steering system 22 and electronically communicating the sensed steering torque to the vehicle simulator 42. In this manner, the calibration system 20 is a closed loop system that provides feedback to the vehicle simulator 42 from the actuator machine 40. The steering torque in the electric power steering system 22 may be sensed in any suitable manner. For example, the steer actuator 34 may include the torque sensor 56, which is capable of measuring torque feedback in the intermediate shaft 32, in response to the applied control inputs 44. The vehicle simulator 42 may then automatically adjust the actuator machine 40 until the sensed steering torque is substantially equal to zero and the actuator machine 40 is positioned to simulate forward, straight, in-line movement.

Once the electric power steering system 22 and the actuator machine 40 have been zeroed, then the control inputs 44 may be communicated from the vehicle simulator 42 to the actuator machine 40. As noted above, the control inputs 44 includes a set of one or more commands to the actuator machine 40 to simulate a specific driving condition, such as a specific turn rate at a specific vehicle speed. The actuator machine 40 then applies a plurality of input forces to the electric power steering system 22, based on the control input 44 from the vehicle simulator 42. For example, the control inputs 44 may include a steering angle, a left tie rod force, and a right tie rod force. Accordingly, the actuator machine 40 operates to apply the forces requested by the control inputs 44, and actuate the steer actuator 34 to provide the steering angle to the intermediate shaft 32 requested by the control input 44.

The electric power steering system 22 may then be controlled with the steering controller 36, to apply the steering setting. The steering controller 36 uses the calibration table 38 to define the steering setting based on the applied input forces and steering angles, and the simulated operating conditions of the vehicle. The steering setting may include or otherwise be referred to as an assist torque, and is the amount of torque added to the electric power steering system 22 by the electric assist motor, to assist the operator in turning the steering system.

The steering response 46 in the electric power steering system 22 is sensed with the torque sensor 56, in response to the applied steering setting, i.e., the applied assist torque. The sensed steering response 46 may include, but is not limited to, at least one of a lateral acceleration, a steering torque feedback, or a roll angle. The sensed steering response 46 generated in response to the applied input forces is communicated to the vehicle simulator 42, and saved in a data file on a memory storage device of the vehicle simulator 42.

The sensed steering response 46 represents the operation of the electric power steering system 22 for the specific control input 44, for the specific vehicle that the power steering calibration table 38 is being developed for. For example, if the steering response 46 to be sensed is the steering torque, i.e., the torque required for the steer actuator 34 to turn the intermediate shaft 32, then it should be appreciated that the sensed steering response 46 would represent the amount of torque required for an operator to turn a steering wheel for that specific control input 44, based on the specific steering setting, i.e., assist torque, currently defined by the calibration table 38. If this value is outside of acceptable or desirable parameters, then a tuning engineer may redefine the calibration table 38 to adjust a value of the steering setting for that specific control input 44, based on the sensed steering response 46. The re-defined calibration table 38 may then be saved as an electronic data file on an electronic memory storage device, or on a memory of the vehicle controller, and re-used and/or re-tested. Until the tuning engineer is satisfied with the steering response 46 for that specific control input 44, representing a specific operating condition.

As noted above, the calibration table 38 provides a variety of different steering setting values, i.e., assist torque values, based on different, specific operating conditions. Accordingly, it should be appreciated that the process described above is repeated for different simulated operating conditions, with each different simulated operating condition having its own control input 44 to simulate the operation of the vehicle at those simulated operating conditions. The above described process may be repeated several times for several different operating conditions, i.e., with several different control inputs 44, to completely tune the power steering calibration table 38.

The detailed description and the drawings or figures are supportive and descriptive of the disclosure, but the scope of the disclosure is defined solely by the claims. While some of the best modes and other embodiments for carrying out the claimed teachings have been described in detail, various alternative designs and embodiments exist for practicing the disclosure defined in the appended claims.

The invention claimed is:

1. A method of tuning a calibration table for an electric power steering system, the method comprising:
   connecting the electric power steering system to an actuator machine, wherein the actuator machine is operable to simulate movement of a vehicle;
   communicating a control input from a vehicle simulator to the actuator machine;
   applying a plurality of input forces and steering angles to the electric power steering system with the actuator machine, based on the control input from the vehicle simulator;
   controlling the electric power steering system with a steering controller, to apply a steering setting, wherein the steering controller uses the calibration table to define the steering setting based on the applied input forces and steering angles;
   sensing a steering response in the electric power steering system with a torque sensor, in response to the applied steering setting; and
   re-defining the calibration table to adjust a value of the steering setting based on the sensed steering response.

2. The method set forth in claim 1 further comprising adjusting the electric power steering system and the actuator machine so that a steering torque is approximately equal to zero before communicating the control input from the vehicle simulator to the actuator machine.

3. The method set forth in claim 2 wherein adjusting the electric power steering system and the actuator machine so that the steering torque is approximately equal to zero includes sensing the steering torque in the electric power steering system and electronically communicating the sensed steering torque to the vehicle simulator.

4. The method set forth in claim 3 wherein adjusting the electric power steering system and the actuator machine so that the steering torque is approximately equal to zero includes automatically adjusting the actuator machine with the vehicle simulator until the sensed steering torque is substantially equal to zero and the actuator machine is positioned to simulate forward, straight, in-line movement.

5. The method set forth in claim 1 further comprising saving the re-defined calibration table as an electronic data file on an electronic memory storage device.

6. The method set forth in claim 1 further comprising defining a vehicle dynamic mathematical model that models the physical and operating characteristics of a specific vehicle.

7. The method set forth in claim 6 further comprising saving the vehicle dynamic mathematical model in an electronic memory storage device of the vehicle simulator, wherein the vehicle simulator uses the vehicle dynamic mathematical model to generate the control input.

8. The method set forth in claim 1 further comprising communicating the sensed steering response generated in response to the applied input forces to the vehicle simulator.

9. The method set forth in claim 8 further comprising saving the sensed steering response in a data file in an electronic memory storage device of the vehicle simulator.

10. The method set forth in claim 1 wherein the sensed steering response includes at least one of a lateral acceleration, a steering torque, or a roll angle.

11. A calibration system for tuning a calibration table for an electric power steering system, the calibration system comprising:

an actuator machine operable to support the electric power steering system and apply input forces and a steering angle to the electric power steering system in response to a control input to simulate movement of a vehicle;

a vehicle simulator disposed in electrical communication with the actuator machine, and operable to communicate the control input to the actuator machine, and receive a sensed steering response from the electric power steering system;

wherein the vehicle simulator includes a processor, and non-transitory memory on which are recorded computer-executable instructions, including a simulator algorithm and a vehicle dynamics mathematical model; wherein the vehicle dynamics mathematical model models the physical and operating characteristics of a specific vehicle; and the simulator algorithm is operable to reference the vehicle dynamics mathematical model and generate the control input therefrom, to simulate the movement and operation of that specific vehicle.

12. The calibration system set forth in claim 11 wherein the actuator machine includes at least 5 degrees of freedom to simulate vehicle jounce, vehicle rebound, vehicle steering angle, vehicle left turn, and vehicle right turn.

13. The calibration system set forth in claim 12 wherein the actuator machine includes a plurality of hydraulic actuators operable to move the electric power steering system to simulate operation of a vehicle.

14. The calibration system set forth in claim 11 wherein the actuator machine is operable to receive the sensed steering response from the electric power steering system, and communicate the sensed steering response to the vehicle simulator.

15. The calibration system set forth in claim 11 wherein the vehicle simulator includes an animation algorithm saved on the non-transitory memory of the vehicle simulator, wherein the animation algorithm includes computer readable instructions that are operable to generate a visual representation on a display device of estimated movement of a vehicle as the actuation machine manipulates the electrical power steering system based on the control input from the vehicle simulator.

* * * * *